United States Patent
Jones et al.

(10) Patent No.: US 7,133,926 B2
(45) Date of Patent: Nov. 7, 2006

(54) BROADCAST COMPRESSED FIRMWARE FLASHING

(75) Inventors: Kevin M. Jones, Tomball, TX (US); Andrew Brown, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1028 days.

(21) Appl. No.: 09/966,650

(22) Filed: Sep. 28, 2001

(65) Prior Publication Data

US 2003/0065754 A1 Apr. 3, 2003

(51) Int. Cl.
*G06F 15/16* (2006.01)
(52) U.S. Cl. .................................... 709/232
(58) Field of Classification Search ............. 709/201, 709/221, 232; 382/235, 246
See application file for complete search history.

(56) References Cited

U.S. PATENT DOCUMENTS

| | | | | |
|---|---|---|---|---|
| 5,604,917 A * | 2/1997 | Saito et al. | ................... | 710/49 |
| 6,134,663 A * | 10/2000 | Nakamura et al. | .......... | 713/201 |
| 6,167,091 A * | 12/2000 | Okada et al. | .......... | 375/240.19 |
| 6,282,643 B1 * | 8/2001 | Cromer et al. | ................. | 713/2 |
| 6,457,175 B1 * | 9/2002 | Lerche | ........................ | 709/221 |
| 6,728,601 B1 * | 4/2004 | Garcia et al. | ................ | 700/286 |
| 6,741,749 B1 * | 5/2004 | Herbert, Jr. | .................. | 382/246 |
| 6,842,790 B1 * | 1/2005 | Pickreign et al. | ........... | 709/245 |
| 6,848,046 B1 * | 1/2005 | Zimmer | ...................... | 713/100 |
| 7,069,431 B1 * | 6/2006 | Dayan et al. | ................ | 709/221 |
| 2001/0052020 A1 * | 12/2001 | Brodie et al. | ............... | 709/232 |
| 2002/0131085 A1 * | 9/2002 | Kobayashi | .................. | 358/1.16 |
| 2003/0028800 A1 * | 2/2003 | Dayan et al. | ................ | 713/200 |
| 2003/0065754 A1 * | 4/2003 | Jones et al. | .................. | 709/221 |
| 2003/0152161 A1 * | 8/2003 | Lambert | ...................... | 375/295 |
| 2004/0255195 A1 * | 12/2004 | Larson et al. | .................. | 714/30 |
| 2005/0099442 A1 * | 5/2005 | Payne | .......................... | 347/14 |

* cited by examiner

*Primary Examiner*—Jason Cardone
*Assistant Examiner*—Ajay M Bhatia

(57) ABSTRACT

The described invention is directed to a system and related method for updating software in multiple remote communication devices where those communication devices are accessible only by relatively low bandwidth communication buses, which buses make the individual transfer of each software image prohibitive. The disclosed invention further envisions shrinking the size of the image to be transferred by Huffman encoding that image on the initiating end and decoding that Huffman encoded image on the receiving end using a frequency table for Huffman encoding that was previously established. In this way, the transferred image need not include the frequency table, thus making the overall transfer smaller.

37 Claims, 5 Drawing Sheets

BROADCAST COMPRESSED FIRMWARE FLASHING

CROSS-REFERENCE TO RELATED APPLICATIONS

This application is related to co-pending application Ser. No. 09/966180, titled "Intelligent Power Management for a Rack of Servers." This application is also related to co-pending application Ser. No. 09/965893 titled "Method for Interrogating and Proliferating a Rack of Servers."

STATEMENT REGARDING FEDERALLY SPONSORED RESEARCH OR DEVELOPMENT

Not applicable.

BACKGROUND OF THE INVENTION

1. Field of the Invention

The present invention relates generally to flashing electrically erasable programmable read-only memories (EEPROMs). More particularly, the preferred embodiments of the present invention are directed to broadcasting images to be flashed to multiple EEPROMs, where the broadcasting occurs to each system supporting the EEPROM flashing substantially simultaneously. Also, the preferred embodiments are directed to reducing the size of the image to be flashed in the broadcast stage of the image transfer by predefining a frequency table for Huffman encoding, and using that frequency table thereafter for encoding and decoding each image transferred. In this way, the Huffman frequency table need not be transferred with the image.

2. Background of the Invention

Every computer system has memory devices with varying degrees of volatility. For example, almost every computer system has random access memory (RAM) for use by the microprocessor in temporarily storing data and programs. However, the contents of the RAM are lost when the computer system is powered down. Computers likewise have some kind of read-only memory (ROM). This ROM generally contains system boot information and basic input/output system (BIOS) programs. The contents of a standard ROM are not lost with a cycle of the power of the computer. This ROM could comprise many different types of read-only memory including ROM that may only be written one time (programmable read-only memory (PROM)), and various PROMs such as ultraviolet erasable PROMs (UVPROMs) and electrically erasable PROMs (EEPROMs). A particular kind of PROM known as flash EEPROM has found particular acceptance. The "flash" portion of the description ostensibly coming from the fact that this particular kind of EEPROM may be erased and rewritten relatively quickly, as compared to a UVPROM, which must be removed from the computing device and placed under ultraviolet light just to be erased.

Flashing EEPROM in the context of computer systems may also take place quickly because of a relatively high bandwidth communication buses between computer system components. Thus, when an EEPROM needs to be flashed, e.g., to update the BIOS, the new software image is transferred from a storage medium of the computer, e.g., a floppy drive, to the EEPROM. The time it takes to transfer the new software image over the high bandwidth bus is relatively insignificant. However, problems arise when the communication pathway between the long-term storage medium and the EEPROM is of low bandwidth. The problems arise in the amount of time it takes to transfer the image across that low bandwidth pathway.

Further, there may be multiple flash EEPROMs that need to be updated coupled to the low bandwidth bus. The amount of time to transfer the image to be flashed thus increases considerably given that the prior art method of transferring these images are to transfer them one at a time.

Thus, what is needed in the art is a way to minimize the amount of time it takes to transfer software images to remote EEPROMs across a low bandwidth bus, especially where the new image is used to flash each downstream EEPROM, and also where the new images are related to the old images on the EEPROMs.

BRIEF SUMMARY OF THE INVENTION

The problems noted above are solved in large part by a system and related method for sending images to be written to EEPROMs. In one aspect of the invention, where each of a plurality of EEPROMs is to receive the same image, the preferred embodiments comprise broadcasting the new image to each of the EEPROM substantially simultaneously. In this way, the time it takes to transfer the images to the EEPROMs is significantly reduced over the prior art technique of transferring each image individually.

In a second aspect of the invention, the image to be broadcast to each of the EEPROMs is compressed prior to being sent. In the preferred embodiments, this compression is done by Huffman encoding. However, the preferred embodiments of the present invention see gains over standard Huffman encoding by predefining a frequency table, and using that frequency table thereafter for each Huffman encoded compression. Since the frequency table is predefined, that frequency table need not be transferred with the Huffman encoded image. In this way, the overall compressed image to be transferred is smaller than standard Huffman encoding.

The preferred implementation of the two aspects of the preferred embodiment described above are in systems where EEPROMs that need new flash images lie downstream of a source of those images across a low bandwidth communication bus or pathway. Broadcasting the new image to the multiple EEPROMs, as well as compressing that image, saves substantial time in the transfer of the image prior to actually flashing in such a system. In a particular embodiment, the source of the new image is a server in a rack mounted computer system. In such a system, the EEPROMs to be flashed are EEPROMs containing software or firmware for communication modules in a communication system dedicated to control of central power supplies for the rack mounted system. The low bandwidth communication bus is an $I^2C$ bus extending between the server and at least one communication module whose EEPROM needs to be updated.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION OF THE PREFERRED EMBODIMENTS

It has been proposed in the computer industry to remove the AC-DC power supplies from the individual servers in the rack mounted server systems and centralize those power supplies. However, physically separating the power supplies from the computers that need that power requires a structure and method to allocate and de-allocate power. Co-pending application Ser. No. 09/966180, titled "Intelligent Power Management for a Rack of Servers", incorporated herein by reference as if reproduced in full below, describes a system to perform the allocation and de-allocation of power.

Figure 1:
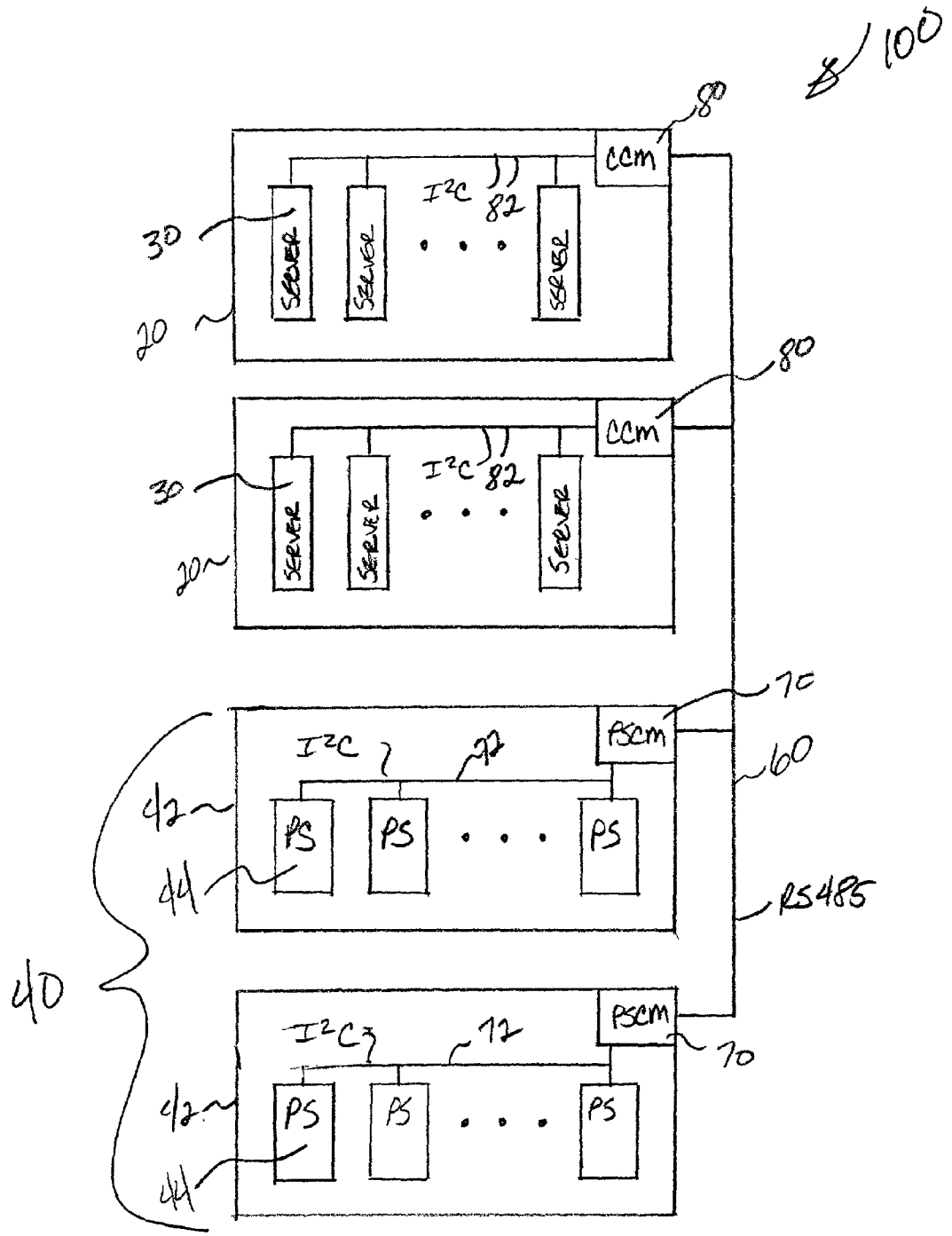
FIG. 1 shows a rack mounted computer system for a specific implementation of the broadcast compressed firmware flashing system.

FIG. 1 shows an implementation of a rack mounted server system 100 which is a specific implementation of the preferred embodiments, and which rack mounted system is of the kind described in the co-pending patent application titled "Intelligent Power Management for a Rack of Servers." In particular, FIG. 1 shows a plurality of chassis 20, each chassis having a plurality of servers 30 therein. Further, FIG. 1 shows a power supply system 40 comprising two power supply assemblies 42. Each power supply assembly 42 preferably houses a plurality of individual power supplies 44.

Each chassis 20 preferably has associated therewith a chassis communication module 80. The chassis communication module 80 in each chassis 20 couples to each individual server 30 across a serial communication bus 82, which in the preferred embodiment is an I²C bus. The I²C bus 82 is a dual line, multidrop serial bus developed by Phillips Semiconductor that comprises a clock line and one data line. The devices connected to the I²C bus can act as either primary or secondary devices, and each device is software addressable by a unique address. Primary devices can operate as transmitters, receivers, or combination transmitter/receivers to initiate eight-bit data transfers between devices on the bus. The I²C bus utilizes collision detection and arbitration to prevent data corruption if two or more primaries simultaneously transfer data. Details regarding the I²C bus may be found in "The I²C-Bus Specification," version 2.1 (January 2000), authored by Phillips Semiconductors.®

Each chassis communication module preferably communicates with the servers 30 in its associated chassis over the I²C bus 82. The chassis communication modules 80 also preferably couple to the power supply communication modules 70 in the power supply system 40. The chassis communication modules 80 and the power supply communication module 70 preferably couple by way of a serial communication pathway 60 being an Institute of Electrical and Electronic Engineers (IEEE) RS-485 bus.

Much like the chassis communication module 80, each power supply communication module preferably couples to a plurality of devices in its associated power supply assembly 42. In particular, the power supply communication module 70 couples to each individual power supply 44 in its associated power supply assembly 42 over an I²C serial bus 72. The power supply communication module may therefore monitor various parameters associated with the individual power supplies 44, including the power output of each individual power supply 44. By polling each individual power supply 44 across the I²C bus 72, each power supply communication module 70 may make a determination as to remaining power capacity, if any, in its respective power supply assembly 42. FIG. 1 shows two power supply assemblies 42, and two power supply communication modules 70. Preferably each of these power supply communication modules 70 has the ability to monitor parameters of the individual power supplies 44 within its respective power supply assembly 42. Preferably, however, only one of the power supply communication modules 70 is designated as the primary power supply communication module, which makes that primary power supply communication module responsible for communicating on behalf of the entire power supply system 40.

Thus, the chassis communication modules 80 transmit requests for allocation of power to the primary power supply communication module 70 over the serial communication pathway 60. Likewise, the primary power supply communication module 70 responds to those requests by sending messages across the serial communication pathway 60 to the requesting server 30, by way of its respective chassis communication module 80.

Figure 2:
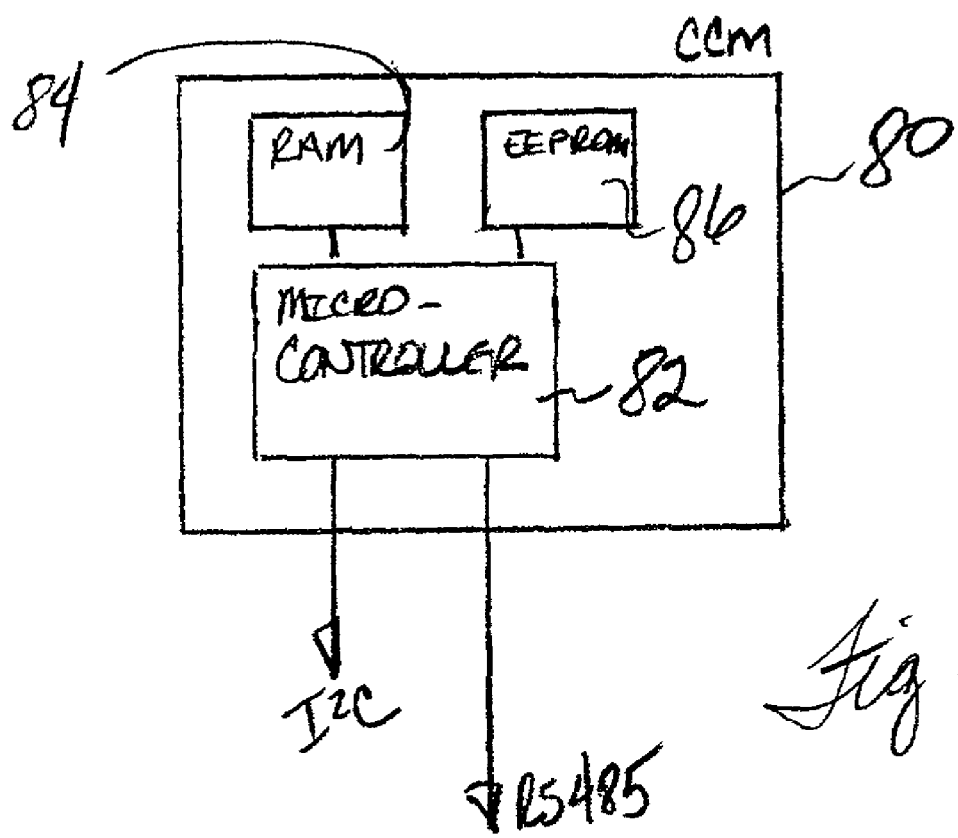
FIG. 2 shows a communication module of the specific implementation.

FIG. 2 shows a chassis communication module 80 of the preferred embodiment. In particular, FIG. 2 shows that the chassis communication module 80 comprises a digital computing means which in the preferred embodiment is a microcontroller 82, preferably a part No. ZIRCON-LH2 manufactured by QLOGIC Corporation; however, equivalent systems could be constructed using any available microcontroller or microprocessor. The chassis communication module 80 also preferably comprises memory means being a random access memory array (RAM) 84 and an electrically erasable programmable read only memory (EEPROM) 86 coupled to the microcontroller. The RAM 84 is preferably working space for executing programs by the microcontroller. The EEPROM 86 preferably stores firmware programs that when executed by the microcontroller 82 perform the various functions required of the chassis communication module 80. FIG. 2 also shows that the microcontroller 82 of the chassis communication module 80 preferably couples to the I²C bus and the RS-485 bus. For purposes of this disclosure, each power supply communication module 70 has substantially the same components as a chassis communication module 80. Thus, FIG. 2 showing the microcontroller 82, RAM 84 and EEPROM 86 for the chassis communication module 80 is equally applicable to the power supply communication module 70.

Of particular importance for this invention is the EEPROM 86 of FIG. 2 (and the corresponding EEPROM in each of the power supply communication modules 70). This EEPROM preferably stores firmware programs that are executed by the microcontroller, which programs direct the microcontroller to perform the various functions required of the power supply communication module 70 and the chassis communication module 80. However, from time to time it is necessary to update that software, e.g., to increase functionality or to fix bugs in the software. For simplicity and ease of manufacture, each of the chassis communication modules 80 and power supply communication modules 70 only communicate via either the I$^2$C bus or the RS-485 bus. That is, preferably there is no external port for accessing or communicating with the microcontroller other than these two serial communication pathways.

Thus, when the programs stored in the EEPROMs of the power supply communication module 70 and the chassis communication module 80 must be updated, that update preferably takes place by means of an individual server 30 initiating a data transfer across the I$^2$C bus 82. In the case of the chassis communication module 80, the transfer preferably also takes place across the serial communication pathway 60. In the preferred embodiment, the I$^2$C bus 82 is clocked at 50 kilohertz, and assuming a one bit transfer with every clock cycle and no packet overhead in the data transfer, 50,000 bits may be transferred across the I$^2$C bus each second. Considering that each EEPROM image (the total file to be flashed onto the EEPROM) may be as large as two megabytes, the transfer of each image alone in the ideal case would take just over five minutes. As one of ordinary skill in the art is aware, data communication systems do not reach 100% packet efficiency; and therefore, a data transfer of two megabytes on a dedicated I$^2$C bus would most like take closer to twenty minutes (assuming a 25% data transfer efficiency). To complicate matters further, in the preferred embodiment the transfer of the new image from a server 30 to a chassis communication module 80 preferably takes place while the chassis communication module 70 is in normal operation. Thus, the complete bandwidth of the I$^2$C bus 82 will not be dedicated to the transfer, therefore increasing the time further. If we assume for purposes of explanation, and not as a limitation, that roughly half of the bandwidth of the I$^2$C bus 82 is dedicated to normal communication, it is clearly seen that the data transfer of a single image from a server 30 to a chassis communication module 80 may take forty minutes or more. Considering that in the preferred embodiment as many as six chassis 20 may be installed in a rack mounted server system 100, it could take as many as four hours to use traditional methods of transmitting software images—one at a time.

Additionally, the preferred embodiment of the rack mounted server system also has two power supply communication modules 70. Thus, the software images for these devices preferably transfer from a server 30 across the I$^2$C bus 82, and then across the serial communication pathway 60 to the power supply communication module 70. While the serial communication pathway 60 is preferably an RS-485 bus and thus has a greater bandwidth than the I$^2$C bus 82, the limiting factor is the transfer from the server 30 to the chassis communication module across the I$^2$C bus 82. Additional delays are encountered in the relaying of information by one of the chassis communication modules 80. Thus, it is seen that to transfer software images to each chassis communication module 80 and each power supply communication module 70 in a rack mounted computer system 100 using prior techniques itself could take as much as four and a half hours or more.

In broad terms, the preferred embodiments of this invention reduce the amount of time to complete the transfer of the software images and flashing of those images onto the various EEPROMs in the system by capitalizing on the fact that each of the power supply communication modules 70 preferably have the same software. Likewise, each of the chassis communication modules 80 preferably have the same software. In the preferred embodiment, a single image is broadcast, and each chassis communication module (for the broadcast of that software image) reads the new image. Likewise, each power supply communication module 70 reads the image during a broadcast of that image by a server 30. In this way, the prior art technique of sending the software image for each particular EEPROM is reduced to only a single broadcast transmission (with error recovery as discussed below). The efficiency of this system thus increases with each additional duplicate EEPROM to be flashed.

Before continuing, it must be understood that the preferred embodiments of this invention, while being developed and having a specific implementation in the context of the rack mounted server system having a central power supply system, are applicable to any system in which multiple flash EEPROMs lie along communication pathway. While the preferred embodiments will be described in the context of such a rack mounted computer system, this should not be read as a limitation on the applicability of the structure and methods described herein.

Still speaking in broad terms, the preferred embodiments of this invention also reduce the size of the image broadcast (in either the chassis communication module case or the power supply communication case) by Huffman encoding. While one of ordinary skill in the art is aware of Huffman encoding, the preferred embodiment obtains gains over standard Huffman encoding by using a predetermined or predefined frequency table, and then just the Huffman encoded information is transferred (as opposed to both the encoded information and the frequency table). This technique is discussed more fully below. Thus, transferring images from a server 30 across a low bandwidth bus 82 is optimized by broadcasting the image to each device that needs that image, as well as compressing that image prior to transfer.

Figure 3:
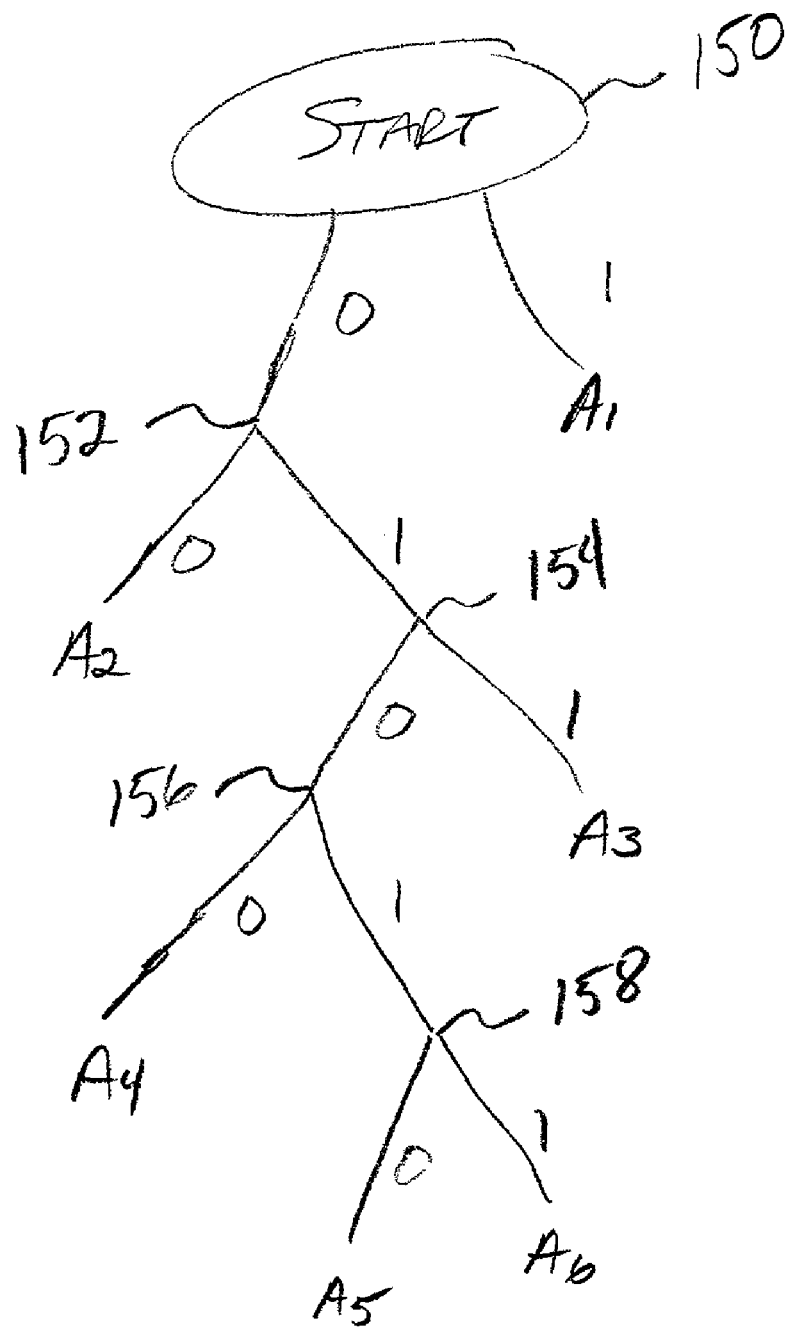
FIG. 3 shows an exemplary frequency table for Huffman encoding.

Huffman encoding is a technique for compressing information that relies on the fact that particular symbols of the uncompressed file have varying probabilities of occurrence within that file. Consider for purposes of explanation a source file having six unique symbols ($A_1, A_2, \ldots A_5$), with each symbol having varying degrees of probability of occurrence within the file. Further assume that the symbol $A_1$ has the highest probability of occurrence, symbol $A_2$ has the next highest probability of occurrence and so on through $A_6$ having the least probability of occurrence within the file. In Huffman encoding, because the symbol $A_1$ has the highest probability of occurrence within the file, it is assigned the smallest, in terms of number of bits, code within the coding scheme. Referring to FIG. 3, there is shown a diagrammatic example of a Huffman frequency table used to decode and encode messages. Because it was assumed that the symbol $A_1$ had the highest probability of occurrence, within the table of FIG. 3 the symbol $A_1$ is represented by a single bit, and arbitrarily assigned logic "1." The second-most probable symbol in the exemplary file is $A_2$. In the exemplary Huffman encoding shown in FIG. 3, the symbol $A_2$ is assigned a code logic "00." Thus, in Huffman encoding, a table such as that shown in FIG. 3 is used to decode a series of zeros and ones which contain the encoded string. As an example, and without limitation, assume that the Huffman encoded string is as follows: 010100111100. Referring still to FIG. 3, the decoding process starts at the start location 150. Because the first bit in the Huffman encoded string is zero, decoding this string proceeds along the zero path to point 152. Because the next bit in the Huffman encoded string is logic "1," the decoding proceeds along the logic "1" path from point 152 to point 154. Likewise, the next bit is a logic "0," which means the decoding process proceeds to point 156. The next bit is a logic "1" meaning that the decision process moves to point 158. Finally, the next bit in the Huffman encoded string is a logic "0," which means that the first symbol represented in the Huffman encoded system is $A_5$. Since we have reached the end of the table and determined the first symbol, the process starts again at start location 150. Continuing in the exemplary code just after the bit that identified the first symbol, the next bit encoded is a "0" so the decode process moves to point 152. The next bit is a "1," forcing the decode process to move to point 154. The next bit is a "1," which leads to the symbol $A_3$. Thus, the second bit in the Huffman encoded string is $A_3$. Starting again at block 150, the next bit encountered is a "1" which leads directly to the symbol $A_1$. Starting again with the next bit, again being a "1," this leads directly to the symbol $A_1$ again. Finally, starting in block 150 with the next bit "0," the decoding process moves to point 152. The final bit in the Huffman encoded string is a "0," thus leading to the symbol $A_2$. Thus, the 12 bits in our exemplary Huffman encoded string 010100111100 decodes to symbols $A_5, A_3, A_1, A_1$ and $A_2$ respectively. It can be clearly seen that if each one of these symbols $A_1 \ldots A_5$ are one byte of information (eight bits), 48 bits of information would have to be sent. Using the Huffman encoding, only 12 bits were required to represent the same information. However, in standard Huffman encoding, the information required to decode the encoded message must also be transferred. In the exemplary table of FIG. 3, 240 bits are required to represent the table. Thus, using standard Huffman, both the encoded message (in the exemplary system 12 bits) and the frequency table (in the exemplary system 240 bits) must be sent.

Thus, the preferred embodiment uses Huffman encoding to reduce the size of the images sent from the server 30 across the $I^2C$ bus 82 to the chassis communication module 80. Likewise, the preferred embodiments use Huffman encoding to decrease the size of the image sent from a server 30 across an $I^2C$ bus 82 and further across a serial communication pathway 60 to a power supply communication module 70. However, the preferred embodiments also achieve performance gains over pure Huffman encoding by using a predefined frequency table (an example of which is shown diagrammatically in FIG. 3). Each of the receiving chassis communication modules 80 and power supply communication modules 70 preferably already have the frequency table, and thus the table need not be sent.

As has been discussed, the process of flashing the power supply communication module 70 and chassis communication module 80 flash EEPROM will generally take place to update the firmware held in the EEPROMs of each of those devices. It is envisioned that while these updates will increase the functionality and/or repair bugs in the code therein, the symbols required to make up that software preferably remain the same. In the preferred embodiments, a frequency table for the Huffman encoding is initially created based on the original programs stored on the EEPROM. That frequency table for Huffman encoding is preferably hard-coded into the EEPROM, and thereafter is used for each update or flash of the EEPROM. Stated otherwise, the initial frequency table for Huffman encoding will most likely not change significantly with minor updates of the software thereon. The preferred embodiments of the present invention shrink the size of the file that must be transferred across the low bandwidth bus by using the same frequency table for each image transfer. Thus, this frequency table need not be transferred; instead, preferably only the Huffman encoded information is sent across the low bandwidth bus. It is acknowledged that in some cases the probability of occurrence of a particular symbol may change in an image to be sent; however, those changes of probability for particular symbols will most likely be limited. Thus, while it may be possible in subsequent Huffman encoded transfers to shrink the size of the image further if a new frequency table were used, those gains would be lost in having to transfer the frequency table every time.

Thus, the preferred embodiments hard-code a predefined Huffman frequency table, and thereafter use that frequency table in decoding images sent across the low bandwidth bus. Likewise, the source of the image, preferably a server 30 within the rack mounted system 100, preferably Huffman encodes each image using that initial frequency table, even if minor changes may have occurred with respect to the probabilities of occurrence of any particular symbol.

Figure 4A:
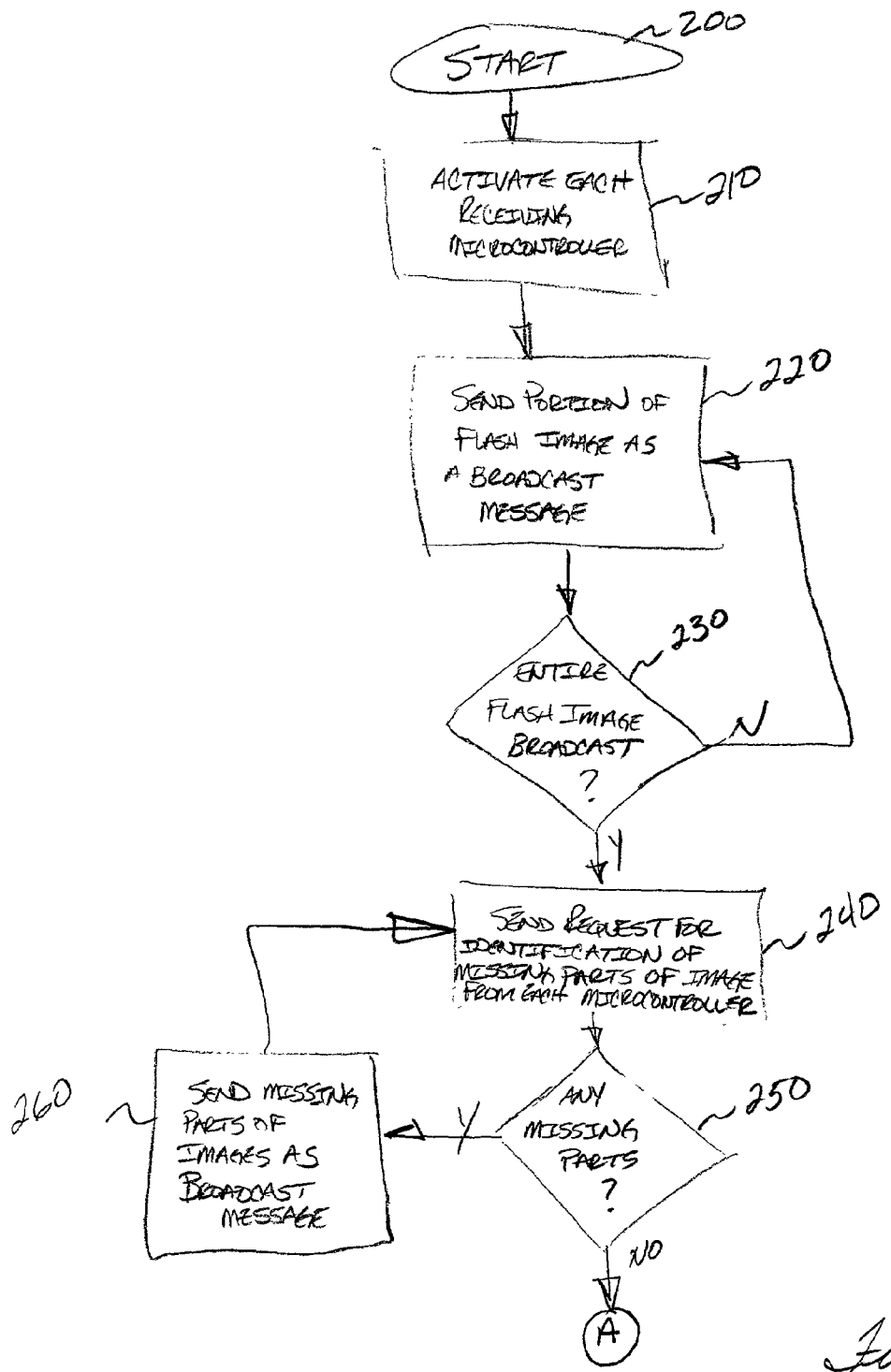
FIG. 4A shows a partial flow diagram of the method of broadcasting the images to the multiple EEPROMs.
Figure 4B:
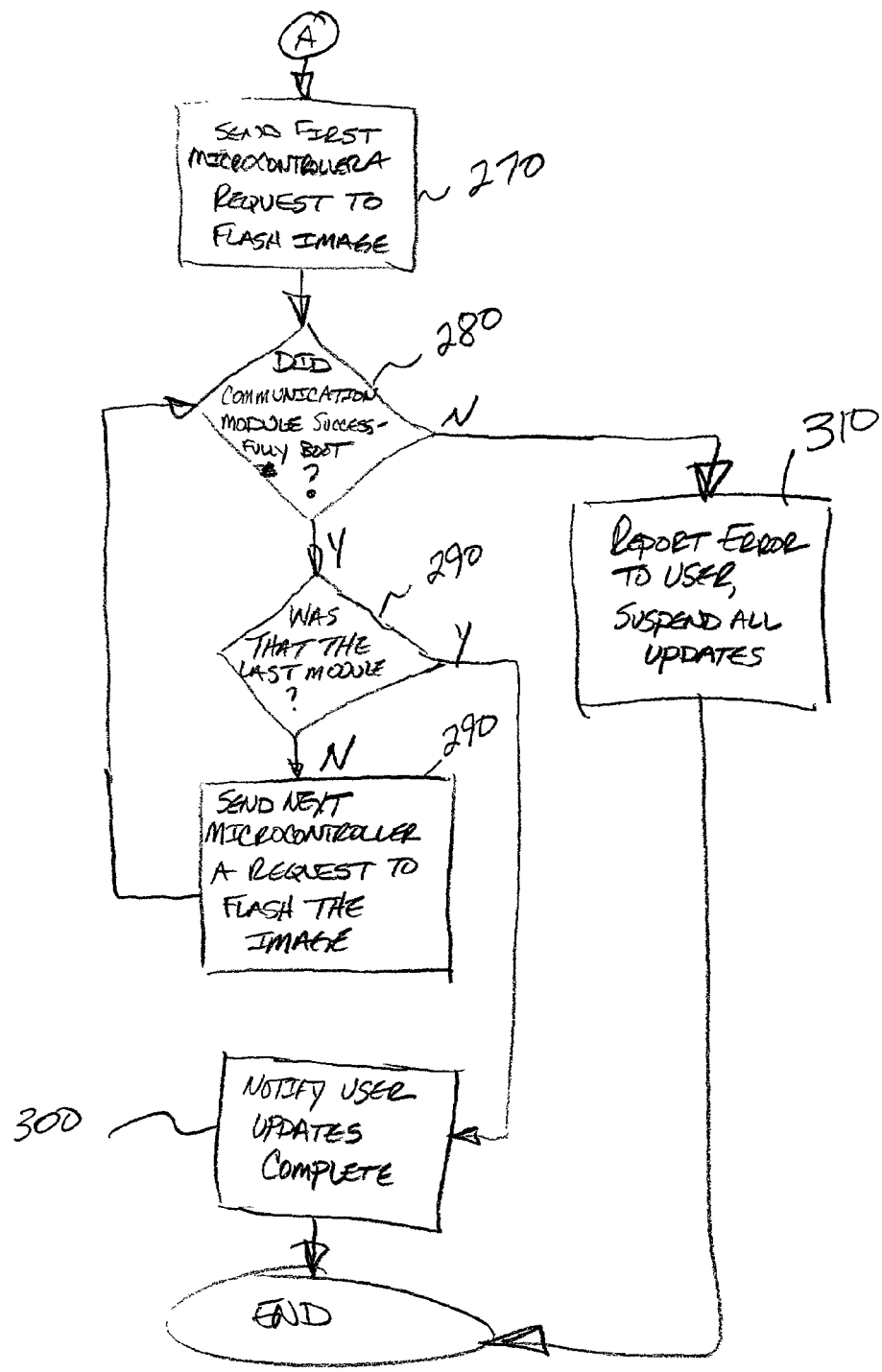
FIG. 4B shows the remaining steps of the flow diagram for broadcasting the images.

Referring now to FIGS. 4A and 4B, there is shown a flow diagram of the preferred method for updating the flash EEPROM in multiple devices across a low bandwidth bus. In particular, the process starts at block 200 and the first step is the activation of each receiving microcontroller, as indicated at block 210. In the preferred embodiments, at least part of the image to be flashed is transferred during normal operation of the communication module (be it the chassis communication module 80 or the power supply communication modules 70). Thus, this step informs each receiving microcontroller of the upcoming broadcast of the new image so that each microcontroller to be updated will be aware of its responsibility to receive and store the packets of information. Once each receiving microcontroller has been activated, preferably the initiating server 30 sends portions of the flash image in packet form as a broadcast message across the network, as indicated at block 220. The process of sending the image in broadcast form continues in small portions until the entire image has been broadcast across the network, as indicated by the combination of blocks 220 and 230.

Once the entire image has been broadcast by the initiating server 30, that server preferably then sends a request to each microcontroller in each communication module to send an identification of parts of the image that each particular microcontroller did not receive, as indicated in block 240. Because the broadcast of the image preferably takes place during normal operation of the communication modules, it is possible that some of the information may be lost due to collisions of data on one or both of the $I^2C$ bus 82 or the serial communication pathway 60. Also, it is possible that a particular microcontroller of a particular communication module may have missed recording a portion of the image broadcast because it was busy servicing other requests. Regardless of the reason, before flashing the image into the ROM, it is necessary to have the complete image. Thus, the step as indicated at block 240 informs the initiating server 30 of those packets missing from each communication module. Thus, if any parts are missing as indicated in block 250, those missing components of the image are sent again in broadcast form as indicated block 260.

This process of sending portions of the image that were not received preferably continues until each microcontroller contains the complete image to be flashed in the RAM associated with the microcontroller. With regard to sending those missing pieces of the image, it will be understood that if more than one microcontroller is missing a single piece of information, the initiating server preferably transmits that missing piece of information only once in broadcast form (similar to the initial image broadcast). In other words, the gaps in each of the images held by each microcontroller are filled in broadcast form, and the efficiency of this process is increased if multiple microcontrollers are missing the same piece of information.

Once each microcontroller has a complete copy of the image to be flashed, the initiating server preferably sends a request to a first microcontroller to decode and flash the image as indicated in block 270 of FIG. 4B. This request, however, is not a broadcast request; but instead, is a specific request for the first microcontroller to flash the image. If the communication module successfully boots after the image flash as indicated in block 280, the process continues to each subsequent microcontroller in each subsequent communication module, as indicated at block 290. If a particular communication module successfully flashes and boots, and it was the last communication module, as indicated at decision block 290, then the process notifies the user that the updates are complete as indicated in block 300, and the process ends. If, however, any communication module fails to properly boot after the firmware flash, the error is reported and subsequent flashing halted, as indicated in block 310. This halting of further flashing is to prevent all modules from becoming inoperable if the image is not stable.

As discussed above, in the preferred embodiments, the broadcast of the image to be flashed is preferably accomplished during normal operations of each of the communication modules. This preferred implementation assumes that each module has sufficient RAM to store the image (which may be up to 2 megabytes), and still have sufficient working memory for performing communication module duties. In the case where the image size is too large to allow sufficient working space, it is preferred that as much of the image as possible is transferred in the broadcast mode. Thereafter, each individual microcontroller in a particular communication module is preferably placed in a pre-load mode wherein normal operations are suspended and the microcontroller is dedicated to receiving the remainder of the image, decoding and flashing that image.

The above discussion is meant to be illustrative of the principles and various embodiments of the present invention. Numerous variations and modifications will become apparent to those skilled in the art once the above disclosure is fully appreciated. For example, the preferred embodiments have been described with respect to a rack mounted computer system having a centralized power supply system apart from the individual servers in the rack. Thus, the method of broadcasting the images and flashing the multiple flash EEPROMs in the communication module across the relatively low bandwidth I$^2$C bus 82 was described with respect to this system. However, one of ordinary skill in the art, now understanding how the flashing takes place could easily design an equivalent system for any application where the flash EEPROMs are located down a communication bus with limited bandwidth such that transferring each individual image becomes prohibitive. Further, the flash EEPROMs of interest in this disclosure are those EEPROMs and communication modules controlled by microcontrollers; however, the system and methods described herein could equivalently be applied to any system in which software needs to be updated in remote devices. It is intended that the following claims be interpreted to embrace all such variations and modifications.

What is claimed is:

1. A method of flashing an image to a plurality of electrically erasable programmable read only memories (EEPROMs) across a communications bus, the method comprising:
   compressing the image to create a compressed image;
   broadcasting the compressed image to the plurality of EEPROMs across the communication bus, wherein the method of broadcasting the compressed image comprises:
   a. broadcasting the compressed image to a plurality of receivers across the communications means in a plurality of broadcast packets, without waiting for confirmation or response from the receivers, wherein the communications bus is of low bandwidth;
   b. querying at least one of the plurality of receivers for a list of missing packets from the compressed image; and
   c. re-broadcasting the missing packets;
   d. repeating steps b and c above until all receivers report no missing packets; and flashing the image on to each of the plurality of EEPROMS.

2. The method of flashing a plurality of EEPROMs as defined in claim 1 wherein compressing the image further comprises:
   creating an initial frequency table of an initial image placed on the plurality of EEPROMs; and
   creating the compressed image using the initial frequency table.

3. The method of flashing a plurality of EEPROMs as defined in claim 2 further comprising refraining from broadcasting the initial frequency table along with the compressed image.

4. The method of flashing a plurality of EEPROMs as defined in claim 2 wherein creating the compressed image further comprises Huffman encoding.

5. The method of flashing a plurality of EEPROMs as defined in claim 1 wherein flashing the image onto each of the plurality of EEPROMs further comprises:
   flashing the image onto each of the plurality of EEPROMs individually; and
   refraining from flashing a remaining EEPROM if any of the plurality of EEPROMs fail to properly flash.

6. A system comprising:
   a communication bus;
   a first computer system coupled to the communication bus;
   a plurality of the computer systems coupled to the first computer system across the communication bus, each of the plurality of computer systems having a electrically erasable programmable read only memory (EEPROM) device having an image thereon; and
   wherein the first computer system is adapted to compress and broadcast a new EEPROM image to each of the plurality of computer systems across the communication bus the new EEPROM image to be de-compressed and place in the EEPROM device of each of the plurality of computer systems, wherein broadcasting comprises:
   a. broadcasting the compressed image to a plurality of receivers across the communications means in a plurality of broadcast packets, without waiting for confirmation or response from the receivers, wherein the communications bus is of low bandwidth;
b. guerving at least one of the plurality of receivers for a list of missing packets from the compressed image; and
c. re-broadcasting the missing packets;
d. repeating steps b and c above until all receivers report no missing packets.

7. The system as defined in claim 6 wherein the first computer system is adapted to Huffman encode the new EEPROM image prior to its transfer, and wherein the first computer system is further adapted to not send the frequency table used for Huffman encoding along with the new EEPROM image.

8. The system as defined in claim 7 wherein the first computer system uses a predefined frequency table to encode each new EEPROM image.

9. The system as defined in claim 7 wherein the plurality of computer systems each uses a predefined frequency table to decode each new EEPROM image prior to flashing.

10. The system as defined in claim 6 wherein each of the plurality of computer systems further comprises:
   a microprocessor coupled to the EEPROM device; and
   a random access memory array (RAM) coupled to the microprocessors;
   wherein the microprocessor is adapted to receive the new EEPROM image broadcast across the communication bus and store the new EEPROM image in the RAM; and
   wherein the microprocessor is further adapted to flash the new EEPROM image to the EEPROM after the entire new EEPROM image is stored in the RAM.

11. The system as defined in claim 10 wherein the first computer system is adapted to compress the new EEPROM image prior to its broadcast.

12. The system as defined in claim 11 wherein the microprocessor of each of the plurality of computer systems is further adapted to decompress the new EEPROM image prior to flashing that new EEPROM image to the EEPROM device.

13. A method of flashing a single image of a plurality of electrically erasable programmable read only memories (EEPROMs) across a communication bus, the method comprising:
   broadcasting the single image across the communication bust to each of the plurality of EEPROMs; and
   flashing the image onto each of the plurality of EEPROMS, sequentially such that an image is verified to work on one system before other systems attempt to flash the image and wherein broadcasting comprises:
   a. broadcasting the compressed image to a plurality of receivers across the communications means in a plurality of broadcast packets, without waiting for confirmation or response from the receivers, wherein the communications bus is of low bandwidth;
   b. querying at least one of the plurality of receivers for a list of missing packets from the compressed image; and
   c. re-broadcasting the missing packets;
   d. repeating steps b and c above until all receivers report no missing packets.

14. The method of flashing a plurality of EEPROMs as defined in claim 13 further comprising, prior to the broadcasting step, compressing the single image to create a compressed single image.

15. The method of flashing a plurality of EEPROMs as defined in claim 14 wherein the broadcasting step further comprises broadcasting the compressed single image across the communication bus to each of the plurality of EEPROMs.

16. The method of flashing a plurality of EEPROMs as defined in claim 15 wherein broadcasting the compressed single image to each of the plurality of EEPROMs further comprises broadcasting the compressed single image across the communication bus being a low bandwidth communication bus.

17. The method of flashing a plurality of EEPROMs as defined in claim 14 wherein compressing the single image further comprises:
   creating an initial frequency table of an initial image placed on the plurality of EEPROMs; and
   creating the compressed single image using the initial frequency table created for the initial image.

18. The method of flashing a plurality of EEPROMs as defined in claim 17 further comprising refraining from broadcasting the initial frequency table along with the compressed single image.

19. The method of flashing a plurality of EEPROMs as defined in claim 17 wherein creating the compressed single image further comprises Huffman encoding the single image using the initial frequency table.

20. The method of flashing a plurality of EEPROMs as defined in claim 13 wherein sending the single image further comprises:
   sending the single image in a plurality of broadcast packets;
   querying each of the plurality of EEPROMs for a list of missing packets from the single image; and
   broadcasting the missing packets from the single image.

21. The method of flashing a plurality of EEPROMs as defined in claim 13 wherein flashing the single image onto each of the plurality of EEPROMs further comprises:
   flashing the single image onto each of the plurality of EEPROMs individually; and
   refraining from flashing a remaining EEPROM if any of the plurality of EEPROMs fail to properly flash.

22. A rack mounted computer system comprising:
   a first chassis having a plurality of servers mounted therein;
   a second chassis having a plurality of servers mounted therein;
   a central power supply system coupled to the first and second chassis and supplying power thereto;
   a first chassis communication module coupled to each server in the first chassis by way of a first communication bus;
   a second chassis communication module coupled to each server in the second chassis by way of a second communication bus;
   a third communication bus coupling the first and second chassis communication module;
   wherein the first chassis communication module comprises:
   a microcontroller coupled to the first communication bus and the third communication bus;
   and an electrically erasable programmable read only memory (EEPROM) coupled to the microcontroller and adapted to store software images executed by the microcontroller;
   wherein the second chassis communication module comprises:
   a microcontroller coupled to the second communication bus and the third communication bus; and an EEPROM coupled to the microcontroller adapted to store software images executed by the microcontroller;

wherein a server of the plurality of servers in one of the first and second chassis is adapted broadcast simultaneously a new software to be flashed to each EEPROM in each of the first and second chassis communication module, wherein the method of broadcasting the image comprises:
   a. brodcasting the compressed image to a plurality of receivers across the communication means in a plurality of braodcast packets, without waiting for confirmation or response from the receivers, wherein the first and second communications bus is of low bandwidth;
   b. querying at least one of the plurality of receivers for a list of missing packets from the compressed image; and
   c. re-broadcasting the missing packets;
   d. repeating steps b and c above until all receivers report no missing packets.

23. The rack mounted computer system as defined in claim 22 wherein the server of the plurality of servers is configured to compress the new software image prior to broadcasting the new software image.

24. The rack mounted computer system as defined in claim 23 further comprising:
   said server of the plurality of servers is configured to use Huffman encoding to compress the new software image; and
   wherein the first server of the plurality of servers is configured to not send a frequency table used for the Huffman encoding along with the new compressed software image.

25. The rack mounted computer system as defined in claim 24 wherein the server of the plurality of servers is further configured to perform the Huffman encoding using a frequency table that is not specifically indicative of the frequency of symbols in the new software image.

26. The rack mounted computer system as defined in claim 24 wherein each of the microcontrollers in each of the first and second chassis communication modules is adapted to use a predefined frequency table to decompress the new software image prior to flashing.

27. A system comprising:
   a first computer means for sending a new software image;
   a plurality of computer means for receiving the new software image, each of the plurality of computer means having an electrically erasable programmable read only memory (ROM) device requiring a software image;
   a communication bus means coupling the first computer means and the plurality of computer means, the communication bus means for allowing the first computer means to send the new software images to the plurality of computer means;
   and wherein the first computer means is adapted to simultaneously broadcast the new software image to each of the plurality of computer means across the communication means, the new software image to be placed in the EEPROM device of each of the plurality of computer means, wherein the method of broadcasting the image comprises:
   a. broadcasting the compressed image to a plurality of receivers across the communications means in a plurality of broadcast packets, without waiting for confirmation or response from the receivers, wherein the communications bus is of low bandwidth;
   b. guerying at least one of the plurality of receivers for a list of missing packets from the compressed image; and
   c. re-broadcasting the missing packets;
   d. repeating steps b and c above until all receivers report no missing packets.

28. The system as defined in claim 27 wherein the first computer means is adapted to compress the new software image prior to its broadcast across the communication means.

29. The system as defined in claim 28 wherein the first computer means is adapted to Huffman encode the new software image prior to its transfer, and wherein the first computer means is further adapted to not send the frequency table used for Huffman encoding along with the new software image.

30. The system as defined in claim 29 wherein the first computer means uses a predefined frequency table to encode each new software image.

31. The system as defined in claim 29 wherein the plurality of computer means each uses a predefined frequency table to decode each new software image prior to flashing.

32. The system as defined in claim 27 wherein each of the plurality of computer means further comprises:
   a digital computing means for executing software programs, the digital computing means coupled to the EEPROM device; and
   a memory means for temporarily storing data and software programs, the memory means coupled to the digital computing means;
   wherein the digital computer means is adapted to receive the new software image broadcast across the communication means and store the new software image in the memory means; and
   wherein the digital computing means is further adapted to flash the new software image to the EEPROM after the entire new software image is stored in the memory means.

33. The system as defined in claim 32 wherein the first computer means is adapted to compress the new software image prior to its broadcast.

34. The system as defined in claim 33 wherein the digital computing means of each of the plurality of computer means is further adapted to decompress the new software image prior to flashing that new software image to the EEPROM device.

35. A method of flashing an image to a plurality of electrically erasable programmable read only memories (EEPROMs) across a communication bus, the method of comprising:
   compressing the image to create a compressed image; wherein compressing the image comprises:
   compressing data using Huffman encoding where a frequency table is computed from data similar to that being transferred, which is available to both the sender and receiver of the transmission; whereby compression is less than ideal, but a reduced amount of data is required to be transferred; and
   broadcasting the compressed image to the plurality of EEPROMs across the communication bus; and
   flashing the image onto each of the plurality of EEPROMs, wherein the method of broadcasting the image comprises:
   a. broadcasting the compressed image to a plurality of receivers across the communications means in a plurality of broadcast packets, without waiting for confirmation or response from the receivers, wherein the communications bus is of low bandwidth;
b. querying at least one of the plurality of receivers for a list of missing packets from the compressed image; and
c. re-broadcasting the missing packets;
d. repeating steps b and c above until all receivers report no missing packets.

36. The method described in claim 35 wherein the frequency table is calculated from the data to be replaced on the plurality of EEPROMs.

37. The method described in claim 35 wherein the frequency table is calculated in advance and stored on one or more of the systems prior to the transfer.

* * * * *

UNITED STATES PATENT AND TRADEMARK OFFICE
CERTIFICATE OF CORRECTION

PATENT NO. : 7,133,926 B2
APPLICATION NO. : 09/966650
DATED : November 7, 2006
INVENTOR(S) : Kevin M. Jones et al.

It is certified that error appears in the above-identified patent and that said Letters Patent is hereby corrected as shown below:

In column 1, line 11, after "Rack" insert -- Name in a Rack --.

In column 9, line 26, delete "block 290," and insert -- block 295, --, therefor.

In column 10, line 27, in Claim 1, delete "EEPROMS" and insert -- EEPROMs --, therefor.

In column 10, line 55, in Claim 6, delete "a" and insert -- an --, therefor.

In column 10, line 61, in Claim 6, delete "bus" and insert -- bus, --, therefor.

In column 10, line 62, in Claim 6, delete "place" and insert -- placed --, therefor.

In column 11, line 3, in Claim 6, delete "guerving" and insert -- querying --, therefor.

In column 11, line 41, in Claim 13, after "image" delete "of" and insert -- to --, therefor.

In column 11, line 46, in Claim 13, delete "bust" and insert -- bus --, therefor.

In column 11, line 48, in Claim 13, delete "EEPROMS," and insert -- EEPROMs, --, therefor.

In column 13, line 4, in Claim 22, after "adapted" insert -- to --.

In column 13, line 5, in Claim 22, after "software" insert -- image --.

In column 13, line 7, in Claim 22, delete "module," and insert -- modules, --, therefor.

In column 13, line 9, in Claim 22, delete "brodcasting" and insert -- broadcasting --, therefor.

In column 13, line 10, in Claim 22, delete "communication" and insert -- communications --, therefor.

UNITED STATES PATENT AND TRADEMARK OFFICE
CERTIFICATE OF CORRECTION

PATENT NO. : 7,133,926 B2
APPLICATION NO. : 09/966650
DATED : November 7, 2006
INVENTOR(S) : Kevin M. Jones et al.

It is certified that error appears in the above-identified patent and that said Letters Patent is hereby corrected as shown below:

In column 13, line 11, in Claim 22, delete "braodcast" and insert -- broadcast --, therefor.

In column 14, line 1, in Claim 27, delete "guerying" and insert -- querying --, therefor.

Signed and Sealed this

Twentieth Day of January, 2009

JON W. DUDAS
*Director of the United States Patent and Trademark Office*